(12) United States Patent
Chen et al.

(10) Patent No.: US 7,768,788 B2
(45) Date of Patent: Aug. 3, 2010

(54) CABINET FOR STORING RACK MOUNT COMPUTER

(75) Inventors: Kevin Chen, 5F., No. 123-10, Singde Rd., Sanchong, Taipei County (TW) 24158; Sio Fu, 14257 E. Don Julian Rd., City of Industry, CA (US) 91746

(73) Assignees: Kevin Chen, Sanchoung, Taipai County (TW); Sio Fu, City of Industry, CA (US); Tony Haung, City of Industry, CA (US); William Chen, City of Industry, CA (US)

( * ) Notice: Subject to any disclaimer, the term of this patent is extended or adjusted under 35 U.S.C. 154(b) by 114 days.

(21) Appl. No.: 11/740,922

(22) Filed: Apr. 27, 2007

(65) Prior Publication Data

US 2008/0232055 A1 Sep. 25, 2008

(30) Foreign Application Priority Data

Mar. 22, 2007 (TW) ............................... 96204497 U

(51) Int. Cl.
*G06F 1/16* (2006.01)

(52) U.S. Cl. ..................... 361/727; 720/654; 312/223.1

(58) Field of Classification Search ......... 361/724–727, 361/685, 683, 679; 720/654; 312/223.1–223.3
See application file for complete search history.

(56) References Cited

U.S. PATENT DOCUMENTS

| 5,461,717 | A  | * | 10/1995 | Notarianni et al. | 361/727 |
| 5,684,671 | A  | * | 11/1997 | Hobbs et al. | 361/683 |
| 6,259,605 | B1 | * | 7/2001 | Schmitt | 361/727 |
| 6,411,506 | B1 | * | 6/2002 | Hipp et al. | 361/686 |
| 6,769,540 | B2 | * | 8/2004 | Hsieh et al. | 312/223.2 |
| 7,042,720 | B1 | * | 5/2006 | Konshak et al. | 361/685 |
| 7,193,856 | B2 | * | 3/2007 | Hidaka | 361/725 |
| 7,200,008 | B1 | * | 4/2007 | Bhugra | 361/724 |
| 2003/0112596 | A1 | * | 6/2003 | Shih | 361/685 |
| 2005/0168932 | A1 | * | 8/2005 | Selvidge et al. | 361/685 |
| 2005/0257232 | A1 | * | 11/2005 | Hidaka | 720/654 |
| 2007/0247804 | A1 | * | 10/2007 | Li et al. | 361/687 |

* cited by examiner

*Primary Examiner*—Lisa Lea-Edmonds
(74) *Attorney, Agent, or Firm*—Chou IP & BioInformatics

(57) ABSTRACT

A cabinet for storing a plurality of rack mount computers is described. The rack mount computers respectively include a plurality of hosts each having a hard disk. The cabinet includes a plurality of drawer-shaped chassis. They are arranged side by side, for respectively contain the hosts. At least one of the rack mount computers can be pulled out by pulling out the drawer-shaped chassis containing the one of the rack mount computers. The pulled drawer-shaped chassis has an L-shaped cap on the hard disk of the host of the pulled rack mount computer.

10 Claims, 3 Drawing Sheets

CABINET FOR STORING RACK MOUNT COMPUTER

BACKGROUND OF THE INVENTION (1) Field of the Invention

This invention relates generally to a computer system, and more particular, to a cabinet for storing rack mount computers.

(2) Description of Related Art

As information technology develops, it is more convenient for people to access information. However, following the convenience of accessing information, the issue "how to maintain information security" becomes more important.

For example, it is convenient for staff of a company to operate a computer host besides his seat. This convenience brings information risk to the company. The operator may forgetfully or even intentionally use or install improper software. The improper software may destroy the computer hosts, or even destroy the whole internet system. On the other hand, some software may be a tool for the staff to disclose confidential information out of the company without its permission.

Therefore, it is desirable to maintain information security for preventing information assets of a company from being improperly used or disclosed.

SUMMARY

A cabinet for storing a plurality of rack mount computers is described. The rack mount computers respectively have a plurality of hosts. The cabinet may include a plurality of drawer-shaped chassis. These chassis may be arranged side by side, for respectively containing the hosts.

Preferably, at least one of the rack mount computers can be pulled out. The one of the rack mount computers can be pulled out by pulling out the drawer-shaped chassis containing the one of the rack mount computers. The pulled drawer-shaped chassis has a height of about 44.45 millimeters. The pulled drawer-shaped chassis has a strip of cover on the host of the pulled rack mount computer. The host of the pulled rack mount computer has a hard disk. The strip of cover has an L-shaped cap on the hard disk. The L-shaped cap is opened so that the hard disk is exposed for being overhauled. The L-shaped cap is closed after the hard disk is overhauled. The drawer-shaped chassis is pushed back.

With the cabinet, the information and its transmission of a company may be all checked by the company, thereby preventing the confidential information from being disclosed. Moreover, a company having the cabinet may set hosts of the rack mount computers more than a conventional company. Furthermore, the L-shaped cap can be opened without wholly opening the strip of cover.

DETAILED DESCRIPTION OF THE INVENTION

A computer system is disclosed. In the following detailed description, numerous specific details are set forth to provide a full understanding of the present invention. It will be obvious, however, to one ordinarily skilled in the art that the present invention may be practiced without some of these specific details. In other instances, well-known structures and techniques have not been shown in detail so as to avoid unnecessarily obscuring the present invention.

Figure 1:
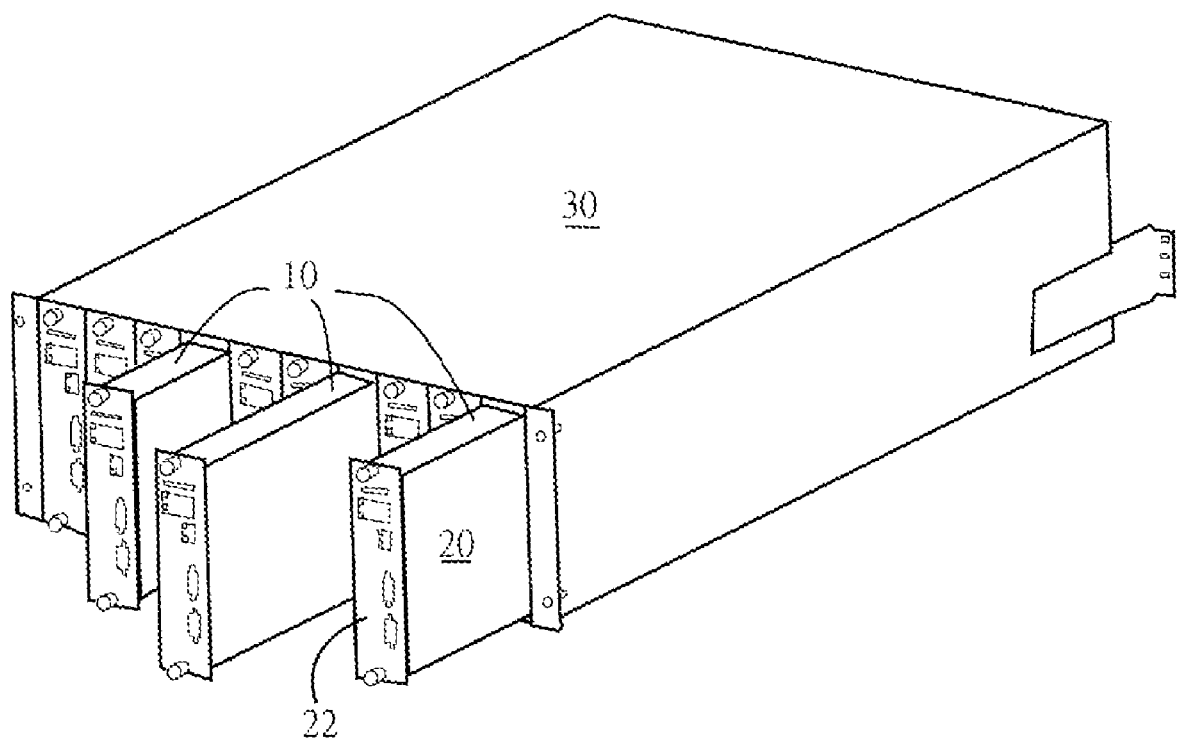
FIG. 1 schematically shows a computer system according to a preferred embodiment of the present invention.
Figure 3:
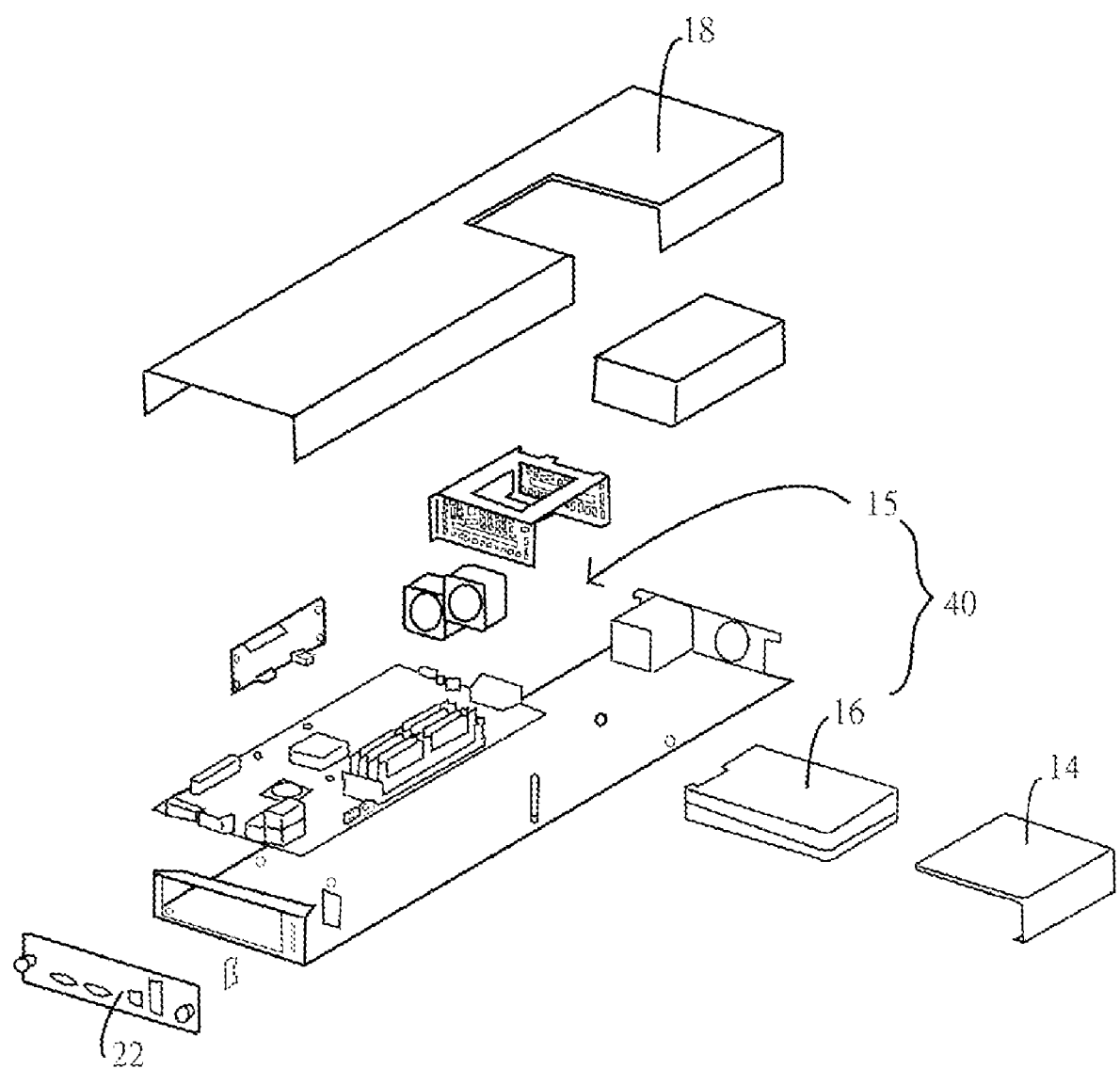

FIG. 1 schematically shows a computer system according to a preferred embodiment of the present invention. Referring to FIG. 1, the computer system may include a cabinet 30. The cabinet 30 is for storing a plurality of rack mount computers 40 (FIG. 3). The rack mount computers may respectively have a plurality of hosts 15. The cabinet 30 (FIG. 1) may include a plurality of drawer-shaped chassis 10. The drawer-shaped chassis 10, may be arranged side by side, for respectively containing the above-mentioned hosts 15 (FIG. 3). The cabinet 30 (FIG. 1) may be wholly made of aluminum.

The quantity of the rack mount computers 40 (FIG. 3) may be, for example, ten. The ten rack mount computers 40 may have at least one can be pulled out from the cabinet 30 (FIG. 1). In one case, all of the rack mount computers 40 (FIG. 3) can be pulled out from the cabinet 30 (FIG. 1). The one of the rack mount computers 40 (FIG. 3) may be pulled out by, for example, pulling out the drawer-shaped chassis 20 (FIG. 1) containing the one of the rack mount computers 40 (FIG. 3). The drawer-shaped chassis 20 (FIG. 1), also a blade-shaped chassis having a very small thickness, may have a height of about 1 U (44.45 millimeters or 1.75 inches).

Figure 2:
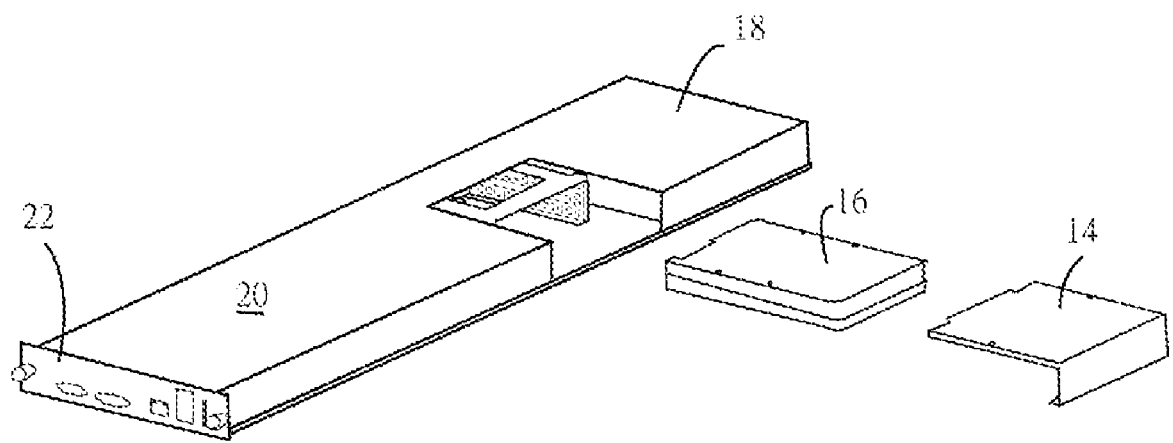
FIG. 2 and FIG. 3 schematically show a mechanism of a plurality of drawer-shaped chassis of FIG. 1, respectively.

FIG. 2 and FIG. 3 respectively and schematically show a mechanism of a plurality of drawer-shaped chassis of FIG. 1. Referring to FIG. 2 and FIG. 3, the pulled drawer-shaped chassis 20 may have a strip of cover 18 on the host 15 of the pulled rack mount computer 40. In the case that the ten rack mount computers 40 are all horizontally lain down, the cabinet 30 including the ten rack mount computers 40 may have a height of about 10 U.

The computer system may have an outputting device such as a screen of a personal computer. The screen may be connected to the host 15 of the rack mount computer 40 through a panel 22. The computer system may have an inputting device such as a computer mouse or a keyboard of a personal computer. The computer mouse or the keyboard may be connected to the host 15 of the rack mount computer 40 through a panel 22. With the outputting device and the inputting device, in case of the ten rack mount computers 40, each host 15 of the ten rack mount computers may be a blade-shaped computer host.

That is, each "blade" may serve as an independent computer host. In this mode, the computer hosts are independently operated to respectively serve different operators. That is, the ten operators may be simultaneously operated the computer system. The computer hosts of the operators are substantially and separately independent, so that the computer hosts can be for the operators to respectively operate or store data.

However, the operators operating the ten computer hosts are not allowed to install or use software not originally installed. If any of the operators need to install or use other software, he should first apply permission from the person in charge such as a MIS of a company.

To achieve the computer system, for one example, the cabinet 30 (FIG. 1) may be located in a facility for being controlled by the person in charge of the company. Each of the hosts 15 of the rack mount computers 40 and its corresponding drawer-shaped chassis 20 may be horizontally lain down, so that the cabinet 30 can serve as a side cabinet.

For another example, the cabinet 30 may be located and locked at some specific area, so that each of the hosts 15 of the rack mount computers 40 and its corresponding drawer-shaped chassis 20 may perpendicularly stand, and is controlled by a specific person. In both of the examples, all information and its transmission may be all checked by the company to prevent the confidential information from being disclosed.

On the other hand, a company having the cabinet 30 may set the hosts 15 of the rack mount computers 40 more than a conventional company, because the former may assemble the hosts 15 in the cabinet 30.

Furthermore, with the cabinet 30 of the present invention, no staff needs space to set a computer host. That is, the cabinet 30 may enhances the utilization of an office of a company.

Referring to FIG. 2 and FIG. 3, the strip of cover 18 may be an n-shaped strip, and may further include an L-shaped cap 14. The L-shaped cap 14 may be on the hard disk 16. The L-shaped cap 14 may be opened, so that the hard disk 16 is exposed for being overhauled.

After the hard disk 16 is overhauled, the L-shaped cap 14 may be closed. The drawer-shaped chassis 20 may be then pushed back to the cabinet 30 (FIG. 1). The host 15 of the pulled rack mount computer 40 often gets the hard disk 16 trouble. To overhaul the hard disk 16, the L-shaped cap 14 may be opened to expose the hard disk 16, without wholly opening the strip of cover 18.

A conventional computer or server may be equipped with an uninterruptible power supply (UPS) to prevent undesired interruption of the power source from the supply from adversely losing information.

In a preferred embodiment of the present invention, the cabinet may also be equipped with such an uninterruptible power supply. The uninterruptible power supply prevents undesired interruption from adversely losing information of the hosts of the rack mount computers. In another preferred embodiment of the present invention, a router, which is often seen in an internet system, may be set in the cabinet of the present invention.

The advantages of the present invention can be described in the following aspects:

The information and its transmission of a company may be all checked by the company, to prevent the confidential information from being disclosed;

A company having the cabinet may set hosts of the rack mount computers more than a conventional company;

An L-shaped cap may be opened to expose a hard disk of a rack mount computer, without wholly opening a strip of cover on the host of the rack mount computer; and An uninterruptible power supply may be equipped to prevent undesired interruption from adversely losing information of hosts of the rack mount computers.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. A cabinet for storing a plurality of rack mount computers, the rack mount computers respectively comprising a plurality of hosts each having a hard disk, the cabinet comprising:
   a plurality of drawer-shaped chassis, arranged side by side, for respectively containing the hosts being independently operated, wherein at least one of the rack mount computers can be pulled out by pulling out the drawer-shaped chassis containing the one of the rack mount computers, and wherein the pulled drawer-shaped chassis has an L-shaped cap on the hard disk of the host of the pulled rack mount computer.

2. A cabinet for storing a plurality of rack mount computers, the rack mount computers respectively having a plurality of hosts, the cabinet comprising:
   a plurality of drawer-shaped chassis, arranged side by side, for respectively containing the hosts being independently operated.

3. The cabinet of claim 2, wherein at least one of the rack mount computers can be pulled out.

4. The cabinet of claim 3, wherein the one of the rack mount computers can be pulled out by pulling out the drawer-shaped chassis containing the one of the rack mount computers.

5. The cabinet of claim 4, wherein the pulled drawer-shaped chassis has a height of about 44.45 millimeters.

6. The cabinet of claim 5, wherein the pulled drawer-shaped chassis has a strip of cover on the host of the pulled rack mount computer.

7. The cabinet of claim 6, wherein the host of the pulled rack mount computer has a hard disk.

8. The cabinet of claim 7, wherein the strip of cover has an L-shaped cap on the hard disk.

9. The cabinet of claim 8, wherein the L-shaped cap is opened so that the hard disk is exposed for being overhauled.

10. The cabinet of claim 9, wherein the L-shaped cap is closed after the hard disk is overhauled, and wherein the drawer-shaped chassis is pushed back.

* * * * *